(12) United States Patent
Nemazie

(10) Patent No.: US 9,251,882 B2
(45) Date of Patent: *Feb. 2, 2016

(54) MAGNETIC RANDOM ACCESS MEMORY WITH DYNAMIC RANDOM ACCESS MEMORY (DRAM)-LIKE INTERFACE

(75) Inventor: Siamack Nemazie, Los Altos Hills, CA (US)

(73) Assignee: Avalanche Technology, Inc., Fremont, CA (US)

(*) Notice: Subject to any disclaimer, the term of this patent is extended or adjusted under 35 U.S.C. 154(b) by 883 days.

This patent is subject to a terminal disclaimer.

(21) Appl. No.: 13/303,947

(22) Filed: Nov. 23, 2011

(65) Prior Publication Data

US 2013/0073791 A1 Mar. 21, 2013

Related U.S. Application Data

(63) Continuation-in-part of application No. 13/235,294, filed on Sep. 16, 2011.

(60) Provisional application No. 61/544,827, filed on Oct. 7, 2011.

(51) Int. Cl.
*G11C 11/16* (2006.01)
*G11C 7/10* (2006.01)
*G11C 7/22* (2006.01)
*G06F 12/08* (2006.01)

(52) U.S. Cl.
CPC .............. *G11C 11/1675* (2013.01); *G11C 7/10* (2013.01); *G11C 7/22* (2013.01); *G06F 12/0879* (2013.01)

(58) Field of Classification Search
CPC ............................ G06F 12/0879; G06F 13/028
USPC .................................. 711/103, 154, 167–169
See application file for complete search history.

(56) References Cited

U.S. PATENT DOCUMENTS

| 3,814,921 | A | 6/1974 | Nibby et al. |
| 4,712,216 | A | 12/1987 | Glaise |
| 4,884,271 | A | 11/1989 | Concha et al. |
| 5,313,475 | A | 5/1994 | Cromer et al. |
| 6,526,537 | B2 | 2/2003 | Kishino |
| 7,447,948 | B2 | 11/2008 | Galbi et al. |
| 7,810,016 | B2 | 10/2010 | Takahashi |
| 2007/0028027 | A1* | 2/2007 | Janzen et al. ............ 711/5 |
| 2008/0016392 | A1 | 1/2008 | Earl et al. |
| 2008/0028135 | A1* | 1/2008 | Rajan et al. .............. 711/106 |
| 2008/0040562 | A1* | 2/2008 | Gower et al. ............. 711/154 |
| 2008/0270741 | A1* | 10/2008 | Tremaine ................. 711/206 |
| 2009/0010044 | A1* | 1/2009 | Sakimura et al. ......... 365/158 |
| 2013/0073790 | A1* | 3/2013 | Nemazie .................. 711/103 |

* cited by examiner

*Primary Examiner* — Ryan Bertram
(74) *Attorney, Agent, or Firm* — Maryam Imam; Bing K. Yen

(57) ABSTRACT

A memory device includes a magnetic memory unit for storing a burst of data during burst write operations, each burst of data includes, sequential data units with each data unit being received at a clock cycle, and written during a burst write operation, wherein the burst write operation is performed during multiple clock cycles. Further, the memory device includes a mask register coupled to the magnetic memory unit that generates a write mask during the burst write operation to inhibit or enable data units of write data, furthermore the memory device allowing burst write operation to begin while receiving data units of the next burst of data to be written or providing read data.

20 Claims, 12 Drawing Sheets $T_{12}$ = Last data cycle & received another WR CMD
$T_{1w}$ = Last data cycle & not received another WR CMD
$T_{2w}$ = Last data cycle
$T_{w1}$ = Received another WR CMD
$T_{wp}$ = Not received another WR CMD
$T_{p1}$ = Received another WR CMD
$T_{pa}$ = Last precharge cycle & ACTIVATE
$T_{pi}$ = Last precharge cycle & NOP

MAGNETIC RANDOM ACCESS MEMORY WITH DYNAMIC RANDOM ACCESS MEMORY (DRAM)-LIKE INTERFACE

CROSS REFERENCE TO RELATED APPLICATIONS

This application claims priority to U.S. Provisional Application No. 61/544,827, filed on Oct. 7, 2011, entitled "MAGNETIC RANDOM ACCESS MEMORY WITH DYNAMIC RANDOM ACCESS MEMORY (DRAM)-LIKE INTERFACE", by Siamack Nemazie and is a continuation-in-part of U.S. patent application Ser. No. 13/235,294, entitled "MAGNETIC RANDOM ACCESS MEMORY WITH BURST ACCESS", by Siamack Nemazie.

BACKGROUND OF THE INVENTION

1. Field of the Invention

The invention relates to write and read operations of a magnetic random access memory (MRAM) and particularly to write and read operations with burst access of MRAM and STTMRAM and using the same to emulate a DRAM like interface with MRAM.

2. Description of the Prior Art

Magnetic random access memory (MRAM) and particularly spin torque transfer MRAM (STTMRAM), which is a type of MRAM, are expected to replace conventional memory, such as static random access memory (SRAM) in various memory applications, such as but not including solid state. However, MRAM and STTMRAM suffer from slower write operations as compared to SRAMs though read operations are less problematic in this regard because MRAM and STTMRAM typically have faster read operations than write operations. For example, a read cycle requires one memory clock cycle to complete by MRAM, whereas, a write operation requires three clock cycles to complete by MRAM. When writing or reading a 'burst' of data, i.e. data that is made of multiple data units and sequential in order, the speed of write operations has been known to improve. However, even in such burst modes, current MRAM and STTMRAM suffer from longer write operations.

What is needed is a method and apparatus for reading and writing to MRAM and STTMRAM in burst mode.

SUMMARY OF THE INVENTION

Briefly, an embodiment of the invention includes a memory device which includes a magnetic memory unit for storing a burst of data during burst write operations, each burst of data includes, sequential data units with each data unit being received at a clock cycle, and written during a burst write operation, wherein the burst write operation is performed during multiple clock cycles. Further, the memory device includes a mask register coupled to the magnetic memory unit that generates a write mask during the burst write operation to inhibit or enable data units of write data, furthermore the memory device allowing burst write operation to begin while receiving data units of the next burst of data to be written or providing read data.

These and other objects and advantages of the invention will no doubt become apparent to those skilled in the art after having read the following detailed description of the various embodiments illustrated in the several figures of the drawing.

IN THE DRAWINGS

Figure 9:
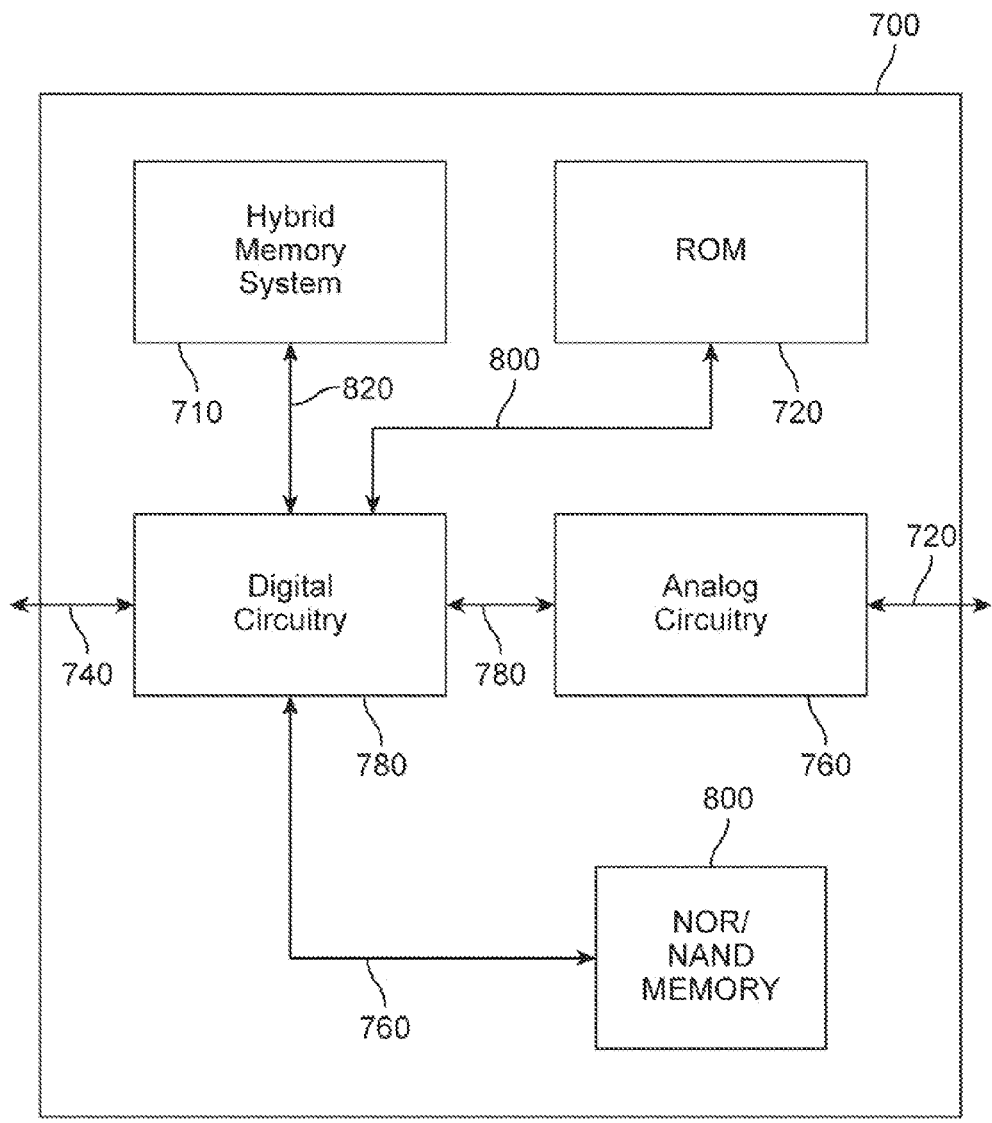

FIG. 9 shows a block diagram of an apparatus 700 incorporating a hybrid memory system 710, which, in some embodiments includes a combination of magnetic memory, analogous to the magnetic memory device 9, and non-volatile memory, and in other embodiments is made of magnetic memory, in its entirety.

Figure 10:
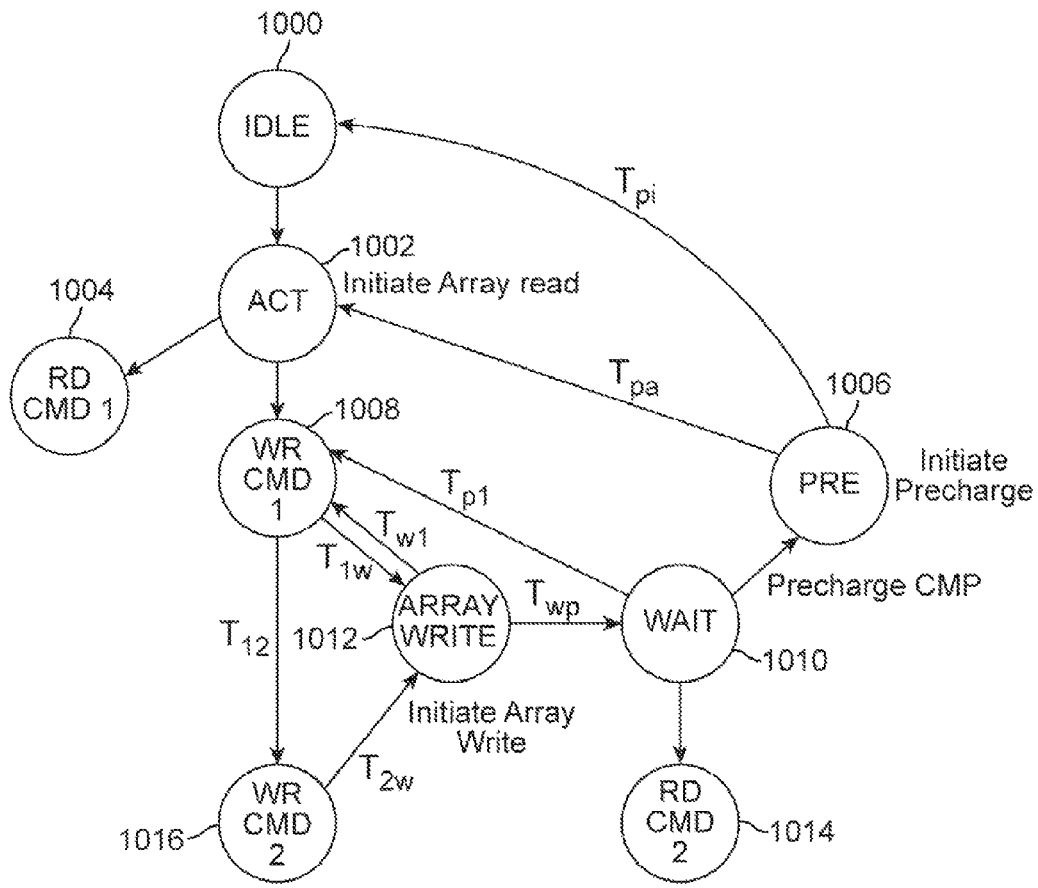

FIG. 10 shows a state diagram of accessing the unit 50 when emulating a DRAM-like interface.

Figure 11:
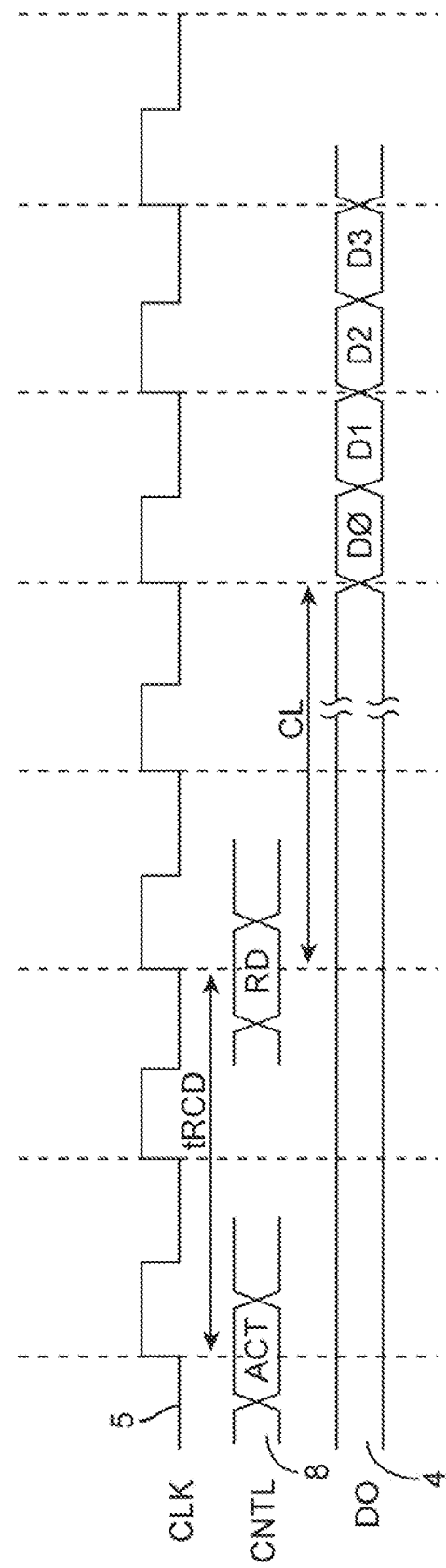

FIG. 11 shows a timing diagram of the relevant signals during an exemplary burst read operation emulating a DRAM-like interface.

Figure 12A:
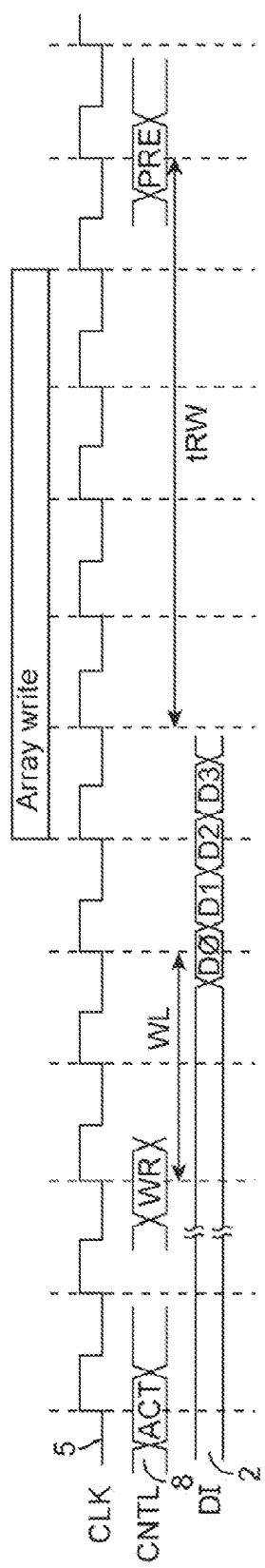
Figure 12B:
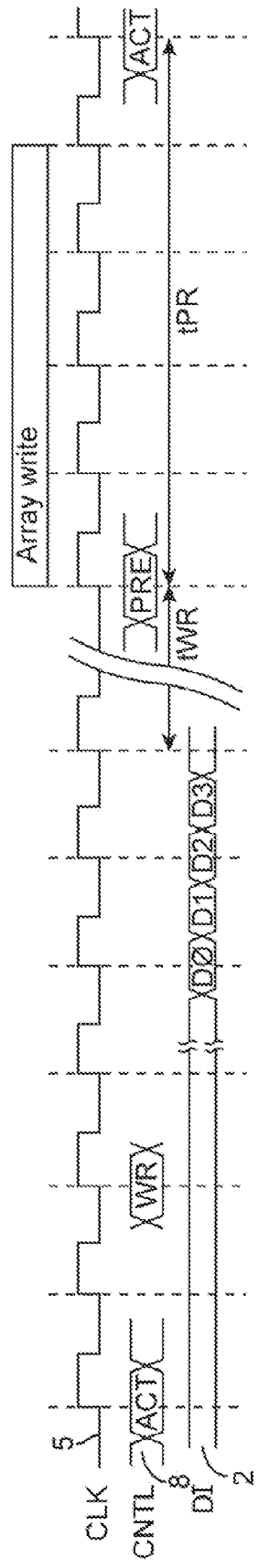

FIGS. 12a and 12b each show a timing diagram of the relevant signals during an exemplary burst write operations emulating a DRAM-like interface.

Figure 13A:
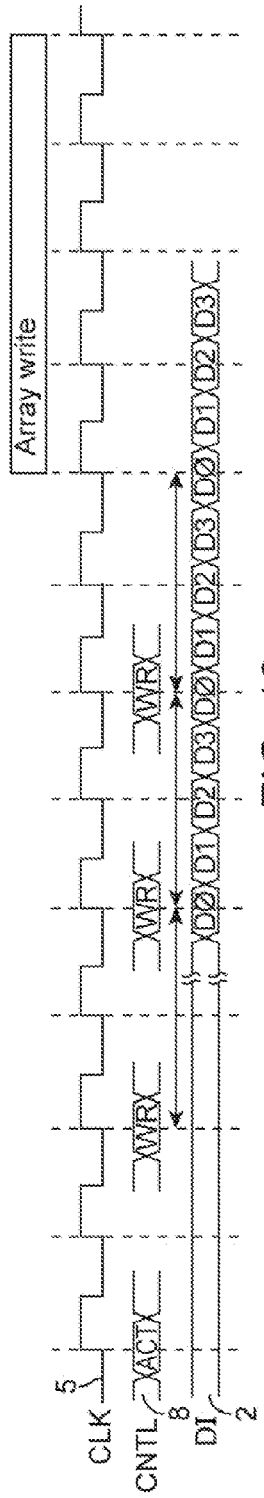
Figure 13B:
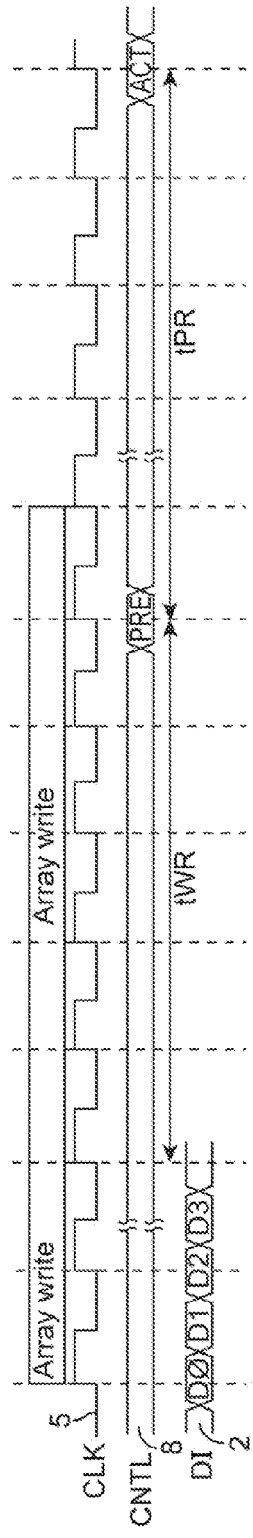
Figure 13C:
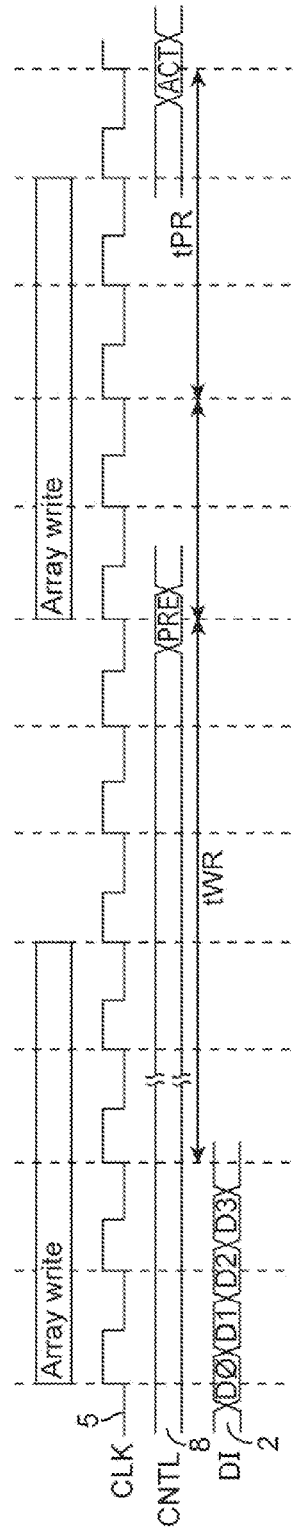

FIGS. 13a, 13b, and 13c each show a timing diagram of the relevant signals during an exemplary burst write operation following a burst write emulating a DRAM-like interface.

Figure 14A:
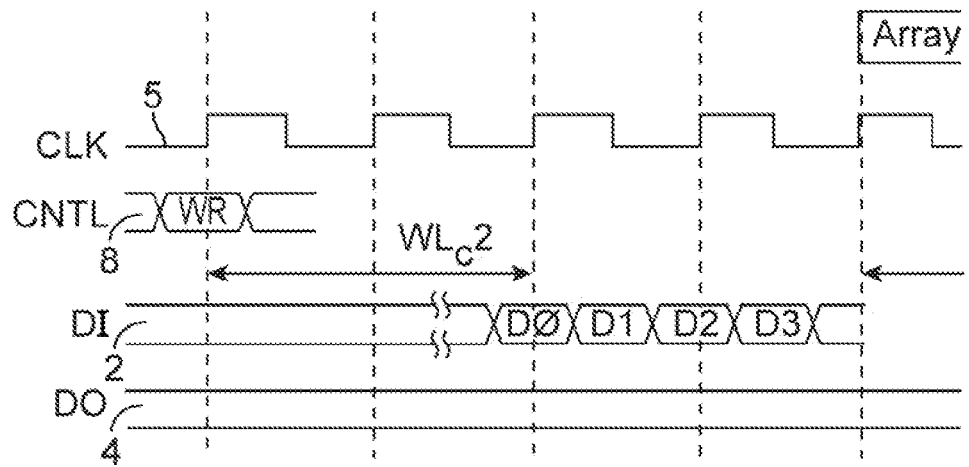
Figure 14B:
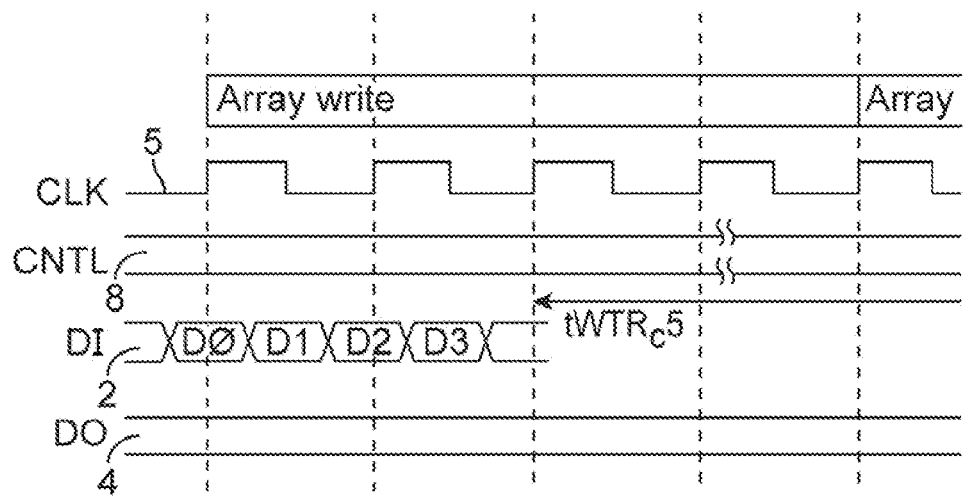

FIGS. 14a and 14b each shows a timing diagram of the relevant signals during an exemplary burst read operation following a burst write operation emulating a DRAM-like interface.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Figure 1:
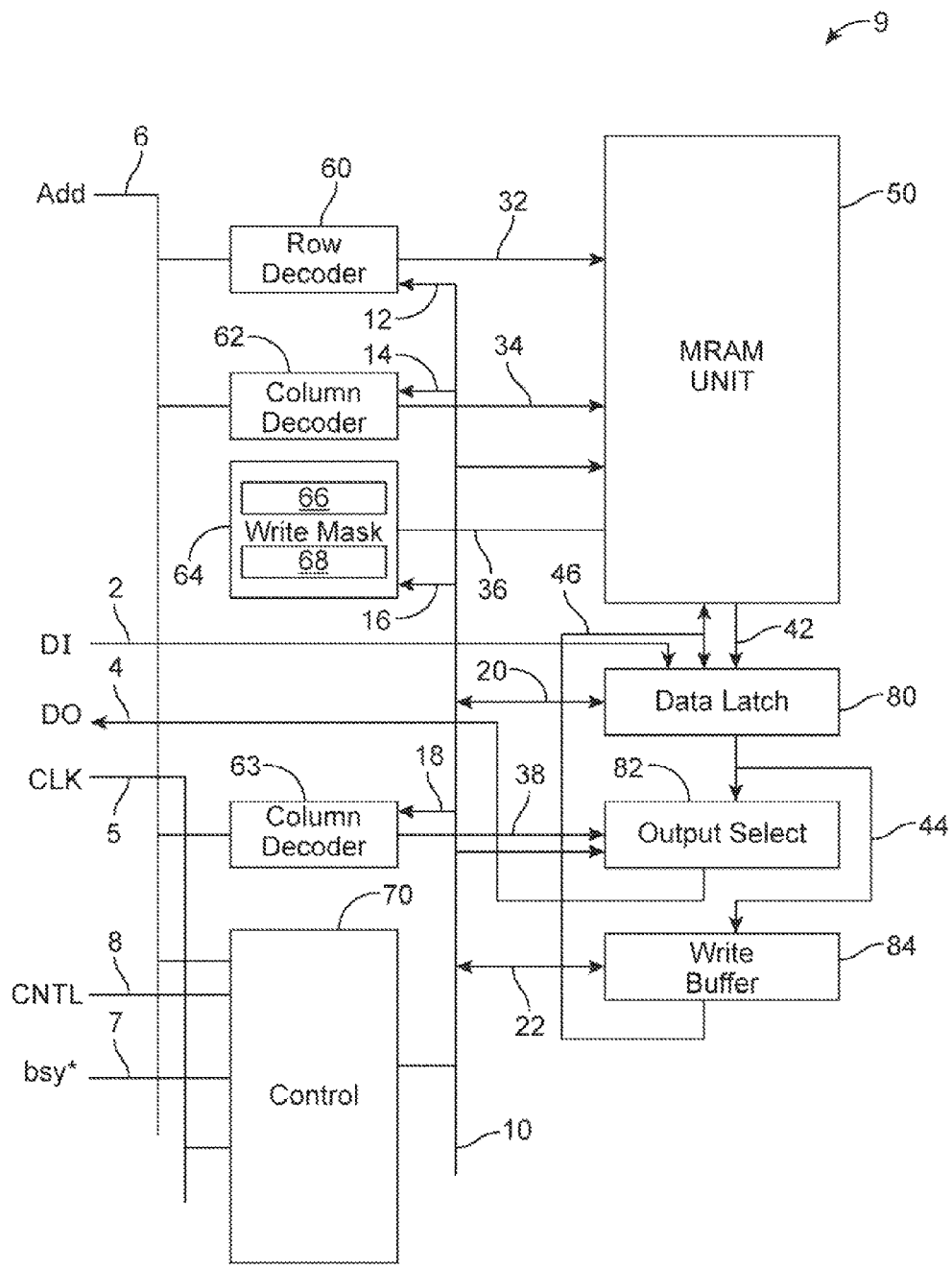
FIG. 1 shows a block diagram of magnetic memory device 9, in accordance with an embodiment of the invention.

FIG. 1 shows a block diagram of magnetic memory device 9, in accordance with an embodiment of the invention. The device 9 is shown to include a magnetic random access memory unit 50, a row decoder 60, a column decoder 62, a mask register 64, a column decoder 63, a control circuit 70, a data latch 80, an output select 82, and a write buffer 84. The mask register 64 is shown to include a write mask register 66 and an auxiliary write mask register 68. The unit 50 may be any kind of magnetic memory, such as but not limited to STTMRAM.

The input to the device 9 is the clock, CLK 5, an address bus Add 6, a data in bus DI 2, and a control CNTL 8. A busy signal 7 is some times referred to herein as "bsy*" and is optionally provided by the device 9 as output. The data out bus DO 4 is an output of the device 9.

Further, the device 9 may be formed on a single integrated circuit (ICs) or broken out into multiple ICs or partially formed on one or more ICs and partially formed externally to the ICs. The address bus 6 is shown coupled to the control circuit 70, the row decoder 60, column decoder 62, and the column decoder 63 for providing an address identifying a location in the unit 50 to which a write or a read operation is performed.

The control circuit 70 is shown to receive control signals 8 and output a busy signal 7. The control circuit 70 is also shown to receive a clock, CLK 5, and to be coupled to a bus 10, which is also coupled to the register 64, the column decoder 62, the column decoder 63, the row decoder 60, the write buffer 84, data latch 80. The data latch 80 is shown to receive memory unit data output 42 "memory unit read data"), DI 2, write buffer output 46 and control signals 20. The output of the data latch 80, i.e. data latch output 44 (also referred to herein as "latched data burst") is provided as input to the output select 82, which outputs data that is read from the unit 50, i.e. DO 4. The data latch output 44 (also referred to herein as "latched data burst") is also provided as input to write buffer 84. The write buffer 84 is shown to provide write buffer output 46 (also referred to herein as "memory unit write data") to the memory unit 50 and to receive its input from the data latch output 44 and the control signals 20.

The data latch 80 is shown coupled to the unit 50 and the write buffer 84 and generates the data latch output 44 to the output select 82 and the write buffer 84. In embodiments using the device 9, to emulate a DRAM interface, such as shown in FIG. 10 on, the data latch 80 does not need to receive the output of the write buffer 84, or write buffer output 46, as shown in FIG. 1.

The row decoder 60 is shown coupled to output the row decoder output 32 to the unit 50. The decoder 62 is shown coupled to the unit 50 through the column decoder output 34 and the register 64 is shown coupled to the unit 50 through the mask register output 36. The column decoder 63 is shown to receive the address bus 6 and to output the column decoder output 38 to the output select 82. The control circuit 70 outputs various control signals to the remaining structures shown in FIG. 1. The column decoder 63 generates a select bus 38, from the address on the address bus 6, for use by the output select 82 whereas the column decoder 62 generates a column select, from the address on the bus 6, for use by the unit 50, and couples the same onto the column decoder output 34. Similarly, the decoder 60 generates a row select to the unit 50 and couples the same onto the row decoder output 32. The combination of the row and column outputs, generated by the decoder 60 and the decoder 62, select a page to be accessed in the device 9, as known to those skilled in the art.

The decoder 62 selects a page within a row and the decoder 63 selects a data unit within the page to be accessed.

In various embodiments, read operations are performed in various modes, such as flow-through mode, registered output mode, or pipelined mode. In flow-through mode, the data that is read is coupled onto the DO 4 (also referred to herein as "data is returned") in the same clock cycle as the cycle in which the command is issued, and in the case of a burst operation, subsequent data is returned in subsequent clock cycles thereafter. This, the first data unit of the burst is returned in the same clock cycle as the cycle in which the command is issued, the second or next data unit of the burst is returned in the next clock cycle and so forth.

In registered output mode, data is returned in the clock cycle after the command is issued and in the case of burst operation, subsequent data units are returned in subsequent cycles thereafter. In pipelined mode, the data unit is returned after a pipeline latency delay, which is a predetermined number of clock cycles, as known to those in the art, and in the case of burst operations, subsequent data units are returned in subsequent cycles thereafter. The registered output mode may be considered a special case of the pipelined mode with a latency of zero. In pipelined mode, if the latency is one or more clock cycles, the bsy* 7 signal is optionally asserted (or active) during the cycle in which the command is issued (received at CNTL 8) and de-asserted in the cycle before the first data unit is returned and remains de-asserted (or inactive) in the case of burst operations for the remainder of the burst. Without loss of generality, the burst read operation is described herein for the case of registered output mode with the understanding that the embodiments and methods discussed and shown herein apply to the remaining modes and any other mode.

The mask register 64 determines whether or not to override data or any portions thereof when write data are being written to the unit 50 by causing circuitry within the unit 50 to inhibit or allow—data units, included in the write data is finally stored in the unit 50. Accordingly, the mask register output 36 is generated by the register 64 for use by the unit 50 to enable or inhibit data units of write data, as will become more evident shortly. Accordingly, the mask register output 36 carries a write mask from the register 64 to the unit 50 for determining which data units of the write data, if any, are inhibited. It is contemplated that the circuitry inhibiting and/or enabling bits of data may be located externally to the unit 50.

The data latch 80 stores the DI 2 and provides its output 44, to the write buffer 84 and the output select 44. The write buffer 84 couples its output onto the data latch 80 and the unit 50. The CLK 5 is a clock whose cycle determines the activation and/or de-activation of certain signals of the device 9.

The device 9 receives commands, such as burst read and write commands, coupled onto the CNTL 8, and the control circuit 70 decodes the same and provides the requisite signals to the remaining structures of the device 9 through the bus 10.

The device 9 receives a read command, from the CNTL 8, requiring accessing of a location within the unit 50 to be read. The address comprises a row address and a column address. The row address identifies the row in which the location within the unit 50 is to be accessed and it is generated by the row decoder 60 from the address received from the address bus 6. The row decoder 60 selects the row to be accessed within the unit 50 (the selected row) and provides the same, through the output 32, to the unit 50. Similarly, the address from the address bus 6 is used by the column decoder 62 to select the page that is being addressed or accessed. The addressed page is read and loaded into the data latch 80. The column decoder 63 selects the data unit, of a burst of data, being addressed within the data latch output 44 and the selected data unit is then coupled onto the DO 4.

In some embodiments, the data access delay is 0 clocks though in other embodiments, any amount of delay is anticipated. Data access delay is the delay, measured in clocks, required to select the addressed data unit at the output select 44 and to couple it onto the DO 4.

When a burst write command is received by the unit 50, the write mask register 66, which is coupled to the auxiliary write mask register 68, is reset. The first data unit of the received burst is clocked into the data latch 80, using the clock cycles of the CLK 5, and the corresponding bit in the register 66 is set. Subsequent data units of the burst are clocked into the data latch 80 and the corresponding bit in the register 66 is set in clock cycles thereafter. When the last data unit of the burst, including any other data within the page of which the burst is a part, is received, the contents of the data latch 80 is saved in the write buffer 84, and the contents of the register 66 are saved in the register 68. The write buffer output 46, along with the output of the register 68, is sent to the unit 50 and a write operation of the unit 50 is initiated. During a burst write operation, all of the data units of output 46 where the corresponding write mask in output 36 is set are written to the unit 50, and another burst command can be received.

The device 9 advantageously allows for writing to the unit 50, a burst of data, while another write command of a burst of data is being received by the data latch 80 because the burst write operation is overlapped with receipt of the a subsequent burst of data. Similarly, a burst of data may be read while a burst write operation is in progress. Whereas, in prior art techniques, another command cannot be issued until the write operation is completed, which is typically signaled by a busy signal being asserted after the command is issued and deasserted in the last cycle of the write operation so as to inhibit issuing a command until the write operation is completed. Thus, the device 9 allows for faster burst write operations of a magnetic memory than that which is currently available. In accordance with various embodiments of the invention, during a write operation, all of the data units within a burst of data are written to the array 52 in one array write operation. This helps to optimize the time that is required to complete a burst write operation since array write access typically requires more time to complete than an array read access.

Moreover, the number of clock cycles used to complete a burst write operation is approximately the same as those required to complete a read operation, therefore rendering the device 9 to emulate SRAM and/or DRAM performance.

Figure 2:
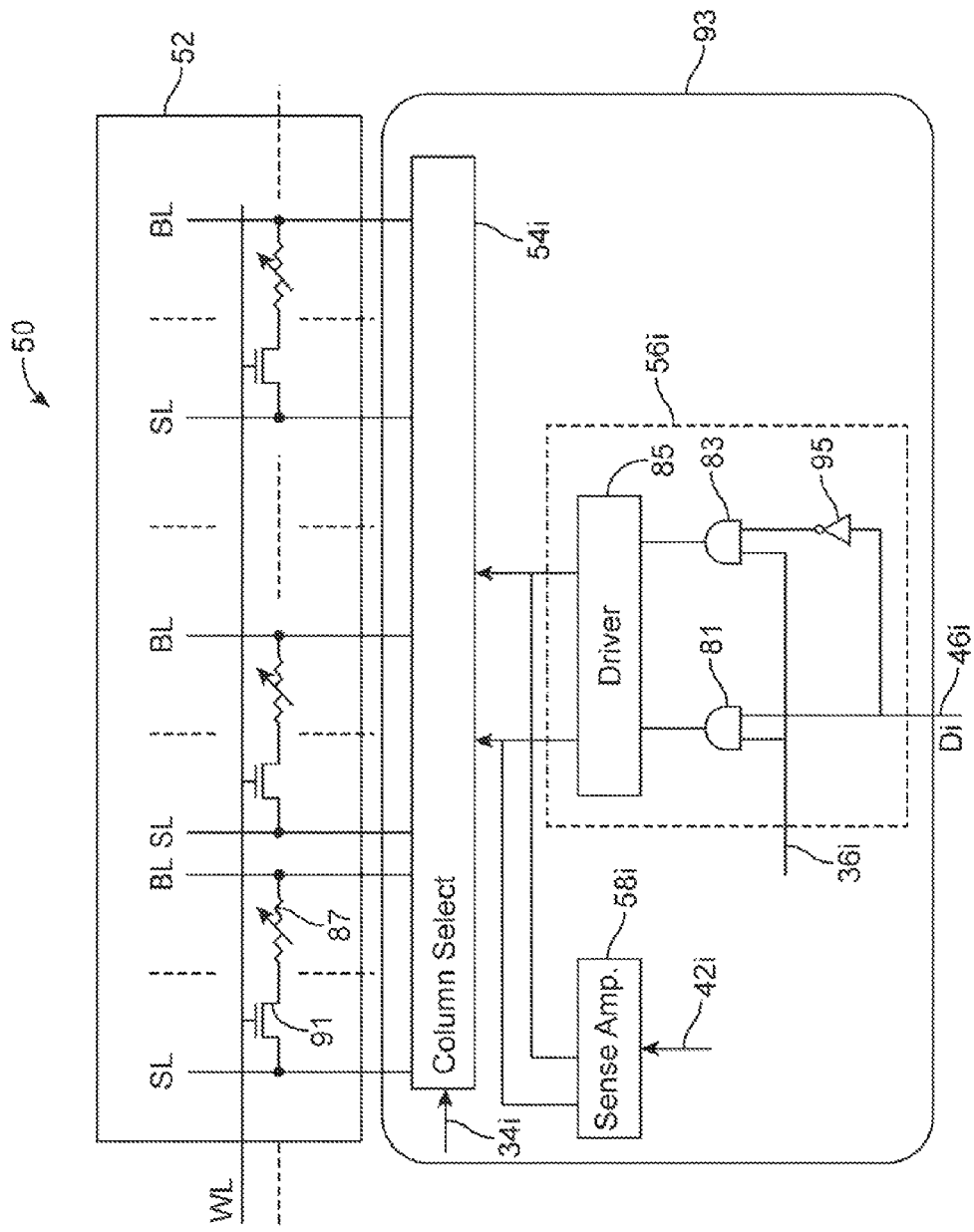
FIG. 2 shows further details of the unit 50, in accordance with another embodiment of the invention.

FIG. 2 shows further details of the unit 50, in accordance with another embodiment of the invention. The unit 50 is shown to comprise a MRAM array 52 coupled to a MRAM array access circuitry 93 with the latter used to facilitate read and write operations to the array 52. The circuitry 93 is shown to include a column select 54i, a sense amplifier 58i, and a column select driver 56i. It is understood that while only one column select and driver are shown, as designated by the notation "i", that a greater number of these circuits are typically included in the unit 50.

The column select driver 56i, which is merely one of many techniques of implementing the function thereof, is shown to include a gate 81, a gate 83, an inverter 95, and a driver 85. The column select driver 56i receives one of the outputs 36i and uses the same to either enable one of the write buffer outputs 46i, or inhibit, as dictated by the state of the output 36i, through the gates 81 and 83. The output of the gates 81 and 83 are provided to the driver 85, which then provides these outputs to the column select 54i. The column select 54i is essentially a de-multiplexer that decodes the input it receives to a greater number of bits that are used to activate/de-active the bit and source lines of the array 52.

The sense amplifier 58i is shown to receive column select signals 57i, as input, and to provide memory unit data output 42i. These column select signals 57i are bidirectional signal, during a write to unit 50, driven by the output of driver 85 and during a read of unit 50 the driver 85 is disabled and signals 57i are input to sense amp 58i. The array 52 is shown to include a number of source line (SL) and a number of bit lines (BL) that are coupled to the memory cells within the array 52. Each memory cell is made up of an access transistor 91 and a MRAM 87. The array 52 is shown to also receive as input a word line, which is also shown coupled to the memory cells thereof and used to select a particular memory row. During write to array, if BL and SL are same the state of MTJ cell 87 is not changed. By convention, if BL="1" and SL="0" then a "0" is written to MTJ and BL="0" and SL="1" then a "1" is written to MTJ. During read, the column select 54i acts as a multiplexer and couples the BL and SL of selected cell to sense amplifier 58i and outputs array output 42i.

It is noted that while the column select driver 56i is shown located within the unit 50, in other embodiments, it may be located externally thereto.

Figure 3:
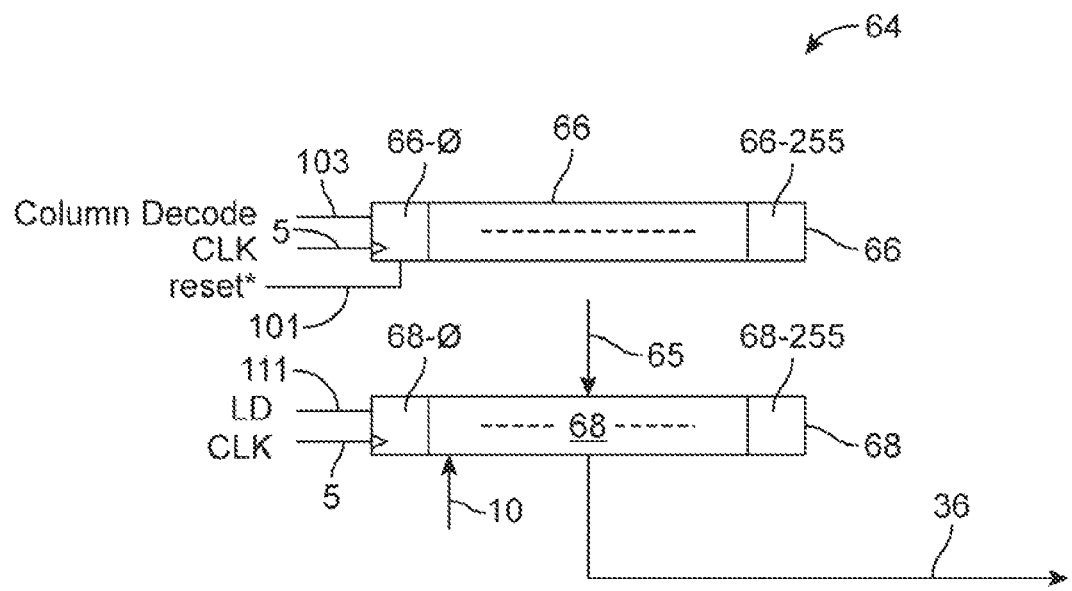
FIG. 3 shows further details of the register 64, in accordance with an embodiment of the invention.

FIG. 3 shows further details of the register 64, in accordance with an embodiment of the invention. As shown in FIG. 3, the registers 66 and 68 each include a mask bit for every data unit in a page. Assuming 256 data units in a page the registers 66 and 68 are each 256 bits wide or stated differently, include 256 registers, one register for each mask bit, though in other embodiments, a different number of mask bits may be employed. The notation "66-0" indicates bit 0 of the register 66 and the notation "66-255" indicates bit 255 of the register 66, similarly, the notation "68-0" indicates the bit 0 of the register 68 and the notation "68-255" indicates the bit 255 of the register 68.

The register 66 is shown to receive the CLK 5, a column decode signal 103, and a reset* signal 101. The signals 103 and 101 are a part of the bus 10 of FIG. 1. The register 68 is shown to receive a load signal, LD 111, the CLK 5, and mask register output 65, the latter of which is received from the register 66, and to output the output 36.

The register 68 stores a mask that is in the form of mask bits, each mask bit corresponding to a data unit of within a page. The state of each mask bit determines whether or not a corresponding data unit of a page is inhibited or enabled and ultimately used by the unit 50 to inhibit or enable the write of corresponding data unit accordingly.

The LD signal 111, when active, causes a mask that is saved in the register 66, to be loaded into the register 68, clocked into the register 68 according to the state of the CLK 5.

When a burst of data is being stored into the data latch 80, through the DI 2, the register 66 is reset by activation of the reset* signal 101, awaiting a new mask.

In some embodiments, when a burst is being written upon the receipt of a write command, the register 66 is reset by activating the reset* signal 101, and a read of the unit 50 is initiated and the addressed page is read and subsequently loaded into the data latch 80 such that the load of data units of the data burst, of the output 42, into the data latch 80 is done by those data units of the output 42 whose corresponding bit in the register 66 is set (or activated), are inhibited and are not ultimately written into the unit 50. Nearly concurrently, the first data unit of the data burst is clocked into the data latch 80, using the CLK 5, and the corresponding bit thereof in the register 66 is set. Subsequent data units of the data burst are clocked into data latch 80 and the corresponding bit in the register 66 is set in clock cycles thereafter. When the last data unit of the data burst is received, the contents of the data latch 80 are saved in write buffer 84, and the contents of the register 66 are saved in the register 68. The output 46, along with the contents of the register 68, is sent to the unit 50 and writing to (or programming of) the unit 50 is initiated. While the burst write operation of the unit 50 is in progress, another write command of the next burst may be received with the receipt of the next burst and processed thereby overlapping the write operation of the current burst with the write operation of the next burst. Also, a read command can be received.

Figure 4:
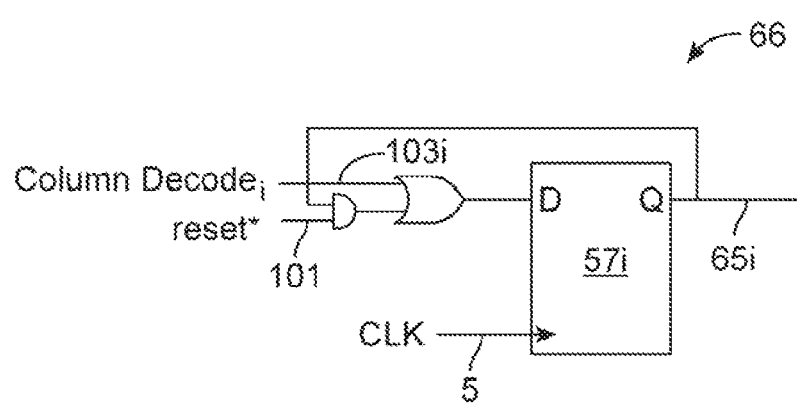
FIG. 4 shows further details of one of the bits of the register 66, in accordance with an exemplary embodiment of the invention.

FIG. 4 shows further details of one of the bits of the register 66, in accordance with an exemplary embodiment of the invention. It is understood that the circuitry of FIG. 4 is merely an example of the manner in which register 66 may be implemented and that other methods and apparatus are contemplated. The subscript "i" in this figure and the discussion herein represents one bit or a part of the structure or signal. For example, "42i" represents one bit of the memory unit data output 42.

In FIG. 4, the column decode signal 103i is one of the bits of the signal 103 of FIG. 3 and in accordance with the circuits shown in FIG. 4, it is stored in the D flip flop 67i shown and D flip flop output is coupled onto the output 65i. The D flip flop 67i is reset when reset* 101 is activated and signal 103i is not set. The reset signal is activated when the reset* signal 101 is at logical value "0" though, in other embodiments, an opposite polarity may be employed to indicate the active state of the signal 101. Reset* signal 101 is a part of the control signals generated by the circuit 70 of FIG. 1, and included in the bus 10. The column decode signal 103i is generated by the column decoder 63 of FIG. 1. The output 65i is provided as input to the register 68 through the signals 65.

Figure 5:
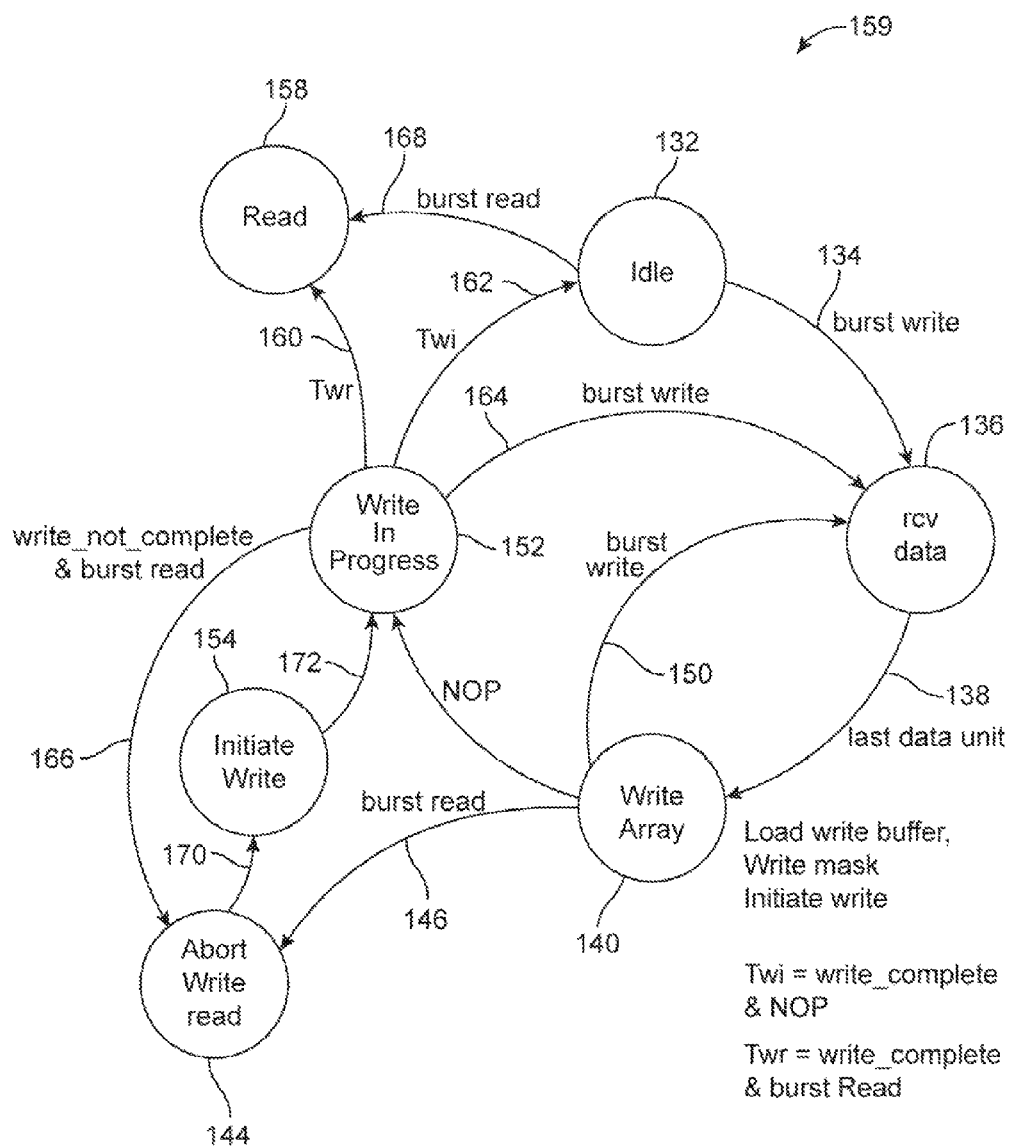
FIG. 5 shows a state diagram of an exemplary method of writing a burst of data in the unit 50, in accordance with a method of the invention.

FIG. 5 shows a state diagram of an exemplary method of writing a burst of data in the unit 50, in accordance with a method of the invention. The process 159 is shown to include an idle state 132, a receive (burst of) data state 136, a write of (burst of) data state 140, an abort write/read state 144, a read state 158, a write-in-progress state 152, and an initiate write state 154. When a burst write command 134 is received by the device 9, the process 159 changes state from idle state 132 to receive data state 136. The process remains at state 136 until all data units of the burst being written are received and upon the receipt of the last data unit, at 138, the process continues to the state 140 where the write buffer 84 is loaded, and the register 68 is loaded, using the LD signal 111 and write to unit 50 is initiated. If in the cycle when last data unit is received a new burst write command is issued the process moves to state 136 again to receive the new burst write data. If in the cycle when last data unit is received a burst read command 146 is issued the process moves to state 144. If at state 140 no commands were issued (NOP) the process 159 moves to state 152. At state 144, the write to unit 50 in progress is aborted and a read to unit 50 is issued. After state 144 the process 159 moves to state 154 to initiate write to unit 50 again. The write to unit 50 is overlapped with sending data out for the burst read. After state 154 the process 159 moves to state 152 waiting for completion of the write to unit 50. At state 152 if another burst write command is issued the process 159 moves to state 136. At state 152 if write to unit 50 is not complete and a burst read command is issued the process 159 moves to state 144. At state 152 if write to unit 50 is completed and a burst read command 146 was issued the process 159 moves to read state 158. At state 152 if write to unit 50 is completed and no commands were issued the process 159 moves to idle state 132.

At idle state 132, the process 159 may receive a read (of a burst of data) command in which case through 168, the process transitions from the state 132 to the state 158 to read a burst of data. Another way to get to the state 158 is through 160 from the state 152 where a current write operation is completed and a burst has been written to the unit 50. At state 158, as mentioned, a burst read is performed.

From the state 152 where the writing of a burst of data is in progress, the process 159 may go to the state 144 through 166 where writing of a burst of data is not yet complete and a burst of data is being read. From the state 144, through 170, the state 154 is processed where a write operation is initiated and from there, through 172, the state 152 is carried out by writing the burst of data through 164, the states 136 and 140 and 138 and 150, as previously discussed. Another way to get to the state 152 is from the state 140.

Another embodiment of overlapped write is when a burst write command is issued, the current register 66 is reset, and a read of the array 52 is initiated and the addressed page is read and subsequently loaded in data latch 80 such that the load of data units within the array output 42 is done based on the corresponding bit in the mask register being set or inhibited. Concurrently, the first data unit of the burst on DI 2 is clocked in the data latch 80 and the corresponding bit in the current register 66 is set. Subsequent data units of the burst are clocked in data latch 80 and the corresponding bit in the register 66 is set in cycles thereafter. When the last data unit of the burst, in this example D3 is received, the data latch 80 is saved in write buffer 84, and the register 66 is saved in the previous write mask register 68. The write buffer output 46 along with the register 68 is sent to array 52 and write to array 52 is initiated, the write mask will enable write of addressed burst, inhibiting write to the rest of page in the array. While the array write is in progress another burst write command can be issued, and array write is overlapped with the reception of the data of the new burst. In general in this embodiment of overlapped write the write access can be as large as the burst size minus one without using bsy* 7 to inhibit issuing a command.

A burst write can be issued when the last data unit of burst is received or any cycle thereafter. If burst read or a burst write is issued when array write is in progress and it is not to same page as the write in progress the array write is aborted and instead the addressed page is read. The array write is restarted in the next cycle and is overlapped with the next burst operation.

Figure 6:
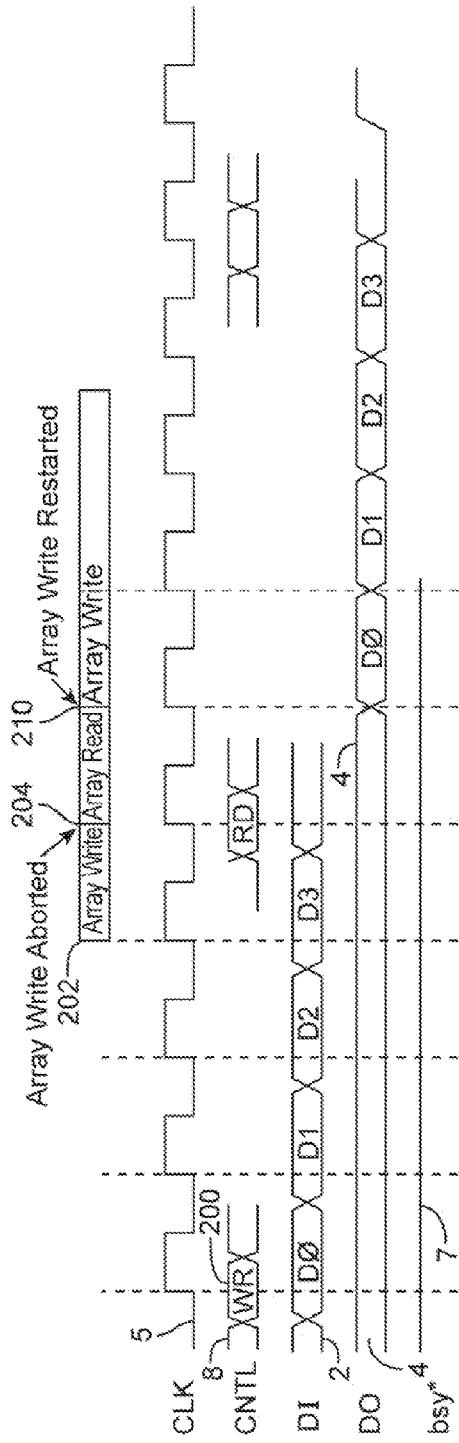
FIG. 6 shows a timing diagram of the behavior of certain signals during a read burst operation that follows a burst write operation, in accordance with a method of the invention.

FIG. 6 shows a timing diagram of the behavior of certain signals during a read burst operation that follows a burst write operation, in accordance with a method of the invention. Specifically, the behavior of CLK 5, CNTL 8, DI 2, DO 4, and bsy* signal 7 is shown in FIG. 6.

At 200, a burst write command is received on the CNTL 8 and data units, D0, D1, D2, and D3, of a burst are received at subsequent cycles on the DI 2 for storage in the unit 50. At 202, a burst write operation to the unit 50 (array write) begins to store the received data units of the burst being written. At 204, a burst read operation starts (array read) by receipt of a read command on the CNTL 206 therefore initiating a burst read operation of the unit 50 and causing aborting of the write operation that started at 200. At 210, the while the data units D0, D1, D2, and D3 are output on subsequent cycles onto the DO 4, the array write, previously aborted, is re-started. The bsy* signal 7 remains inactive the entire time in FIG. 6. In this example the write to unit 50 takes 3 cycles, while the read of unit 50 takes 1 cycle.

To summarize some of the events of FIG. 6, a burst read operation, at 204, follows a burst write operation which starts at 202, with the burst including 4 data units. Read access of the unit 50 is 1 cycle in this example, write access to the unit 50 is three cycles.

A burst read operation begins and a burst read command is issued when the last data unit of the burst (D3) is received at DI 2 or any cycle thereafter. If a burst read command is issued when a burst write operation is in progress and it does not require accessing the same page as the page that is accessed by the burst write operation, the array write operation is aborted and instead the addressed page is read and loaded into the data latch 80. The burst write operation is restarted in the next clock cycle, or at 210. The read data is clocked out while the write operation to the unit 50 is in progress, with the write operation that is in progress being completed during the time the read data is being clocked out.

If however, a burst read operation is issued when an burst write operation is in progress, and the issued burst read operation requires accessing all or a part of the address that is being updated by the burst write operation that is in progress, the output 44 is coupled onto the DO 4 in the cycles corresponding to accessing the address that is being updated while the burst write operation is in progress, which avoids data coherency issues. That is, data coherency, readily known to those in the art, is checked to ensure that the data being read is valid in light of a write operation to the same location. In one embodiment, the write buffer output 46 is coupled onto the output 44 in the cycles corresponding to accessing the address that is being updated by the array write operation that is in progress. All other embodiments fall within scope of the invention.

The examples provided herein assume a burst of a predetermined number of data units, such as four data units, however, it is understood that other number of data units may be included in a burst.

Figure 7:
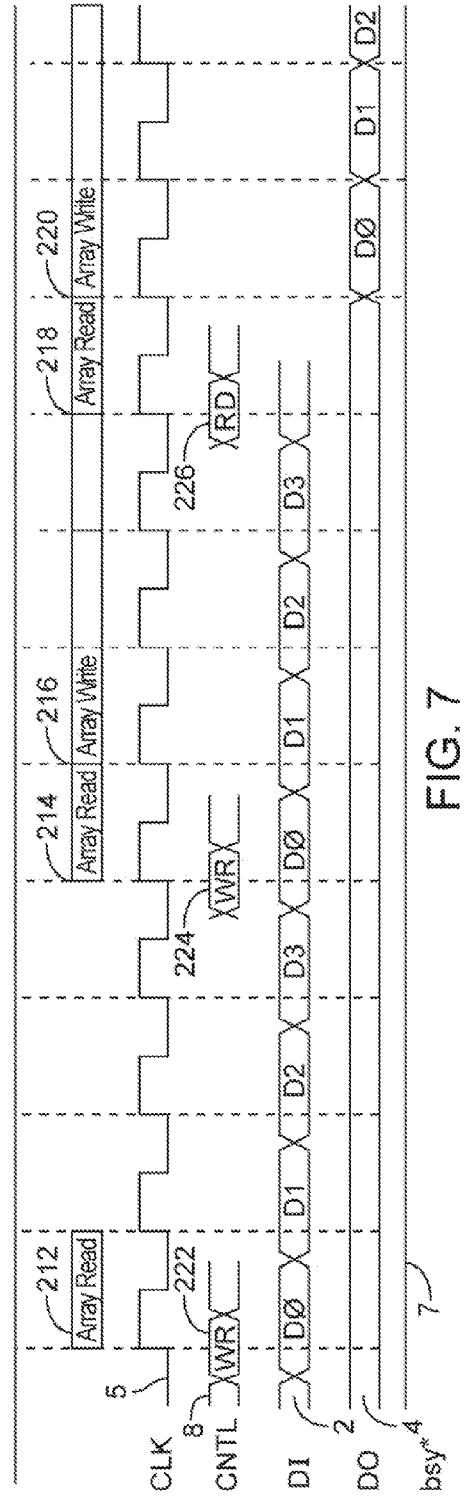
FIG. 7 shows a timing diagram of the behavior of certain signals during a write burst operation that follows another burst write operation, in accordance with another method of the invention.

FIG. 7 shows a timing diagram of the behavior of certain signals during a write burst operation that follows another burst write operation, in accordance with another method of the invention where after reception of a burst write command, a read operation of unit 50 is performed. Specifically, the behavior of CLK 5, CNTL 8, DI 2, DO 4, and bsy* signal 7 is shown in FIG. 7.

At 212, an array read begins while a write command is being received on the CNTL 8. The data to be stored, D0, D1, D2, D3, is received at subsequent cycles on the DI 2. At 224, another burst write operation is started by receipt of a write command on CNTL 8 but another read of unit 50 is started at 214 followed by an array write at 216. At 226, a read command is received on the CNTL 8 and another read of unit 50 is started at 218 followed by an array write starting at 220. In this example the write to unit 50 takes 3 cycles, while the read of unit 50 takes 1 cycle.

The bsy* signal 7 remains inactive the entire time in FIG. 7.

Figure 8:
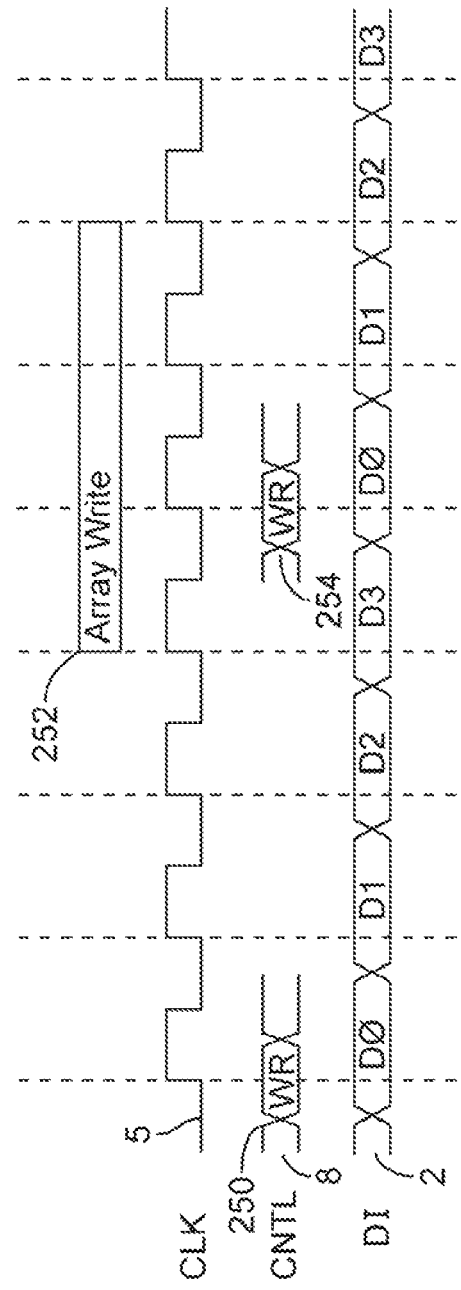
FIG. 8 shows a timing diagram of the behavior of certain signals when a burst write operation occurs, in accordance with another method of the invention.

FIG. 8 shows a timing diagram of the behavior of certain signals when a burst write operation occurs, in accordance with another method of the invention. In FIG. 8, the CLK 5, CNTL 8, and DI 2 are shown. A write command is coupled onto the CNTL 8 at 250, along with a data burst of four data units, D0, D1, D2, and D3, being received at DI 2. Several CLK 5 clock cycles later, a burst write operation is started at 252, during the receipt of data unit D3 at DI 2, followed by another write command being received on CNTL 8, at 254, which starts receipt of another burst, including four data units. Accordingly, the burst write operation to the unit 50 is overlapped with the receipt of a data burst at DI 2.

It is understood that MRAM embodiments shown and described herein may be formed from STTMRAM and/or other similar magnetic memory. Moreover, double data rate (DDR) and low power double data rate (LPDDR), DDR3, LPDDR2 interfaces, and other variations thereof, are contemplated.

FIG. 9 shows a block diagram of an apparatus 700 incorporating a hybrid memory system 710, which, in some embodiments includes a combination of magnetic memory, analogous to the magnetic memory device 9, and non-volatile memory (such as static random access memory (SRAM) or dynamic random access memory (DRAM)), and in other embodiments is made of magnetic memory, in its entirety. The apparatus 700, which is understood as being an exemplary application with many others being contemplated, is shown to include a digital circuitry 780 (comprising a micro processor) coupled to the magnetic memory system 710 and a ROM 720 and an analog circuitry 760 (comprising power on reset generator, low power voltage detect, voltage regulator and a NOR/NAND memory 800. The NOR/NAND memory 800 is another form of memory used to store data. Additionally the analog circuitry 760 transmits and receives analog data 720 and converts the analog data to digital form for use by the digital circuitry 780 through the digital data 780. The ROM 720 is yet another form of memory used to store data during manufacturing of the apparatus 700 and whose contents are read through the signals 800. The system 710 communicates data through the signals 820 to and from the digital circuitry 780. The apparatus 700 transmits and receives information through the interface 740, and the analog data 720. In some embodiments, the digital circuitry 780 is a microprocessor although other digital circuitry in addition thereto or in replacement thereof is contemplated.

DRAM Like Memory Interface

For DRAM like interface a row and page are used interchangeably. The page size needs to be large enough to meet the requirements of a DRAM like interface. Again it is obvious to one of ordinary skill in the art that this is not a limitation of the present invention.

DRAM and DDR SDRAM interface are well known in the art. The embodiment is described using DDR SDRAM interface. The Reader is referred to DDR2 SDRAM data sheet available from several manufactures, in particular Micron Technology, Inc. data sheet for 2 Gb DDR2 SDRAM MT74H128M16 Revision F dated December 2010. Few aspects of the interface are reviewed below All commands are defined by states of control signals CNTL 8 (RAS* 8c, CAS* 8d, WE* 8e, ... ) at the rising edge of the clock.

The DDR2 interface uses bidirectional input/out data DQ and separate (optionally differential) data strobe (DQS, DQS*). For simplicity and without loss of any generality we continue to use separate data input DI and data output DO and Clock CLK for strobing data (Data is strobed at both edges of the clock clk.) description of specific embodiment of a DRAM like interface. Additionally DDR2 interface has other signals and that are not used here. It should be obvious to one ordinarily skilled in the art that this is not a limitation and the scope of the invention covers DDR2 and similar interfaces.

The NO OPERATION (NOP) command is used to indicate the selected DRAM to perform a NOP. This prevents unwanted commands from being registered during idle or wait states. Operations already in progress are not affected The ACTIVATE command is used to open (or activate) a row in a particular bank for a subsequent access. The PRE-CHARGE command is used to deactivate the open row in a particular bank or the open rows in all banks.

The READ command is used to initiate a (fixed programmable) burst read access to an active row. The WRITE command is used to initiate a (fixed programmable) burst write access to an active row. Optionally an auto precharge can be selected at the end of a burst, if auto precharge is not selected, the row will remain open for subsequent access until PRE-CHARGE occurs.

After a row is opened with an ACTIVATE command, a READ or WRITE command may be issued to that row after a tRCD delay. tRCD is the delay in clock cycles the earliest clock edge after the ACTIVATE command on which a READ or WRITE command can be entered.

Posted CAS Additive Latency (AL) allows a READ or WRITE command to be issued prior to tRCD by delaying the actual registration of the READ/WRITE command to the internal device by AL clock cycles. The READ or WRITE command is held for the time of the AL before it is issued internally to the device. Read latency (RL), is controlled by the sum of AL and CL; RL=AL+CL. WRITE latency (WL) is equal to RL minus one clock; WL=AL+CL−1. In this embodiment, without loss of generality, the Posted CAS Additive Latency is not used After a row is opened with an ACTIVATE command, a READ or WRITE command may be issued to that row after a tRCD delay (typically 12.5-15 ns). After a READ command is registered the first data unit will be available after CAS Latency (CL) delay (typically 15 ns). CAS Latency (CL) is the delay, in clock cycles between a READ command and availability of the first data unit.

In this embodiment a DDR2-800 SDRAM is emulated. The Clock cycle is 2.5 ns; corresponding to a frequency of 400 MHz, with data transfer at 800 MHz. Some timing parameters of the said DRR2-SDRAM are listed below in Table 1:

TABLE 1

| tRCD | Activate to Read or Write delay | 12.5-15 ns (5-6 cycles) |
| tCAS | CAS Latency (CL) | 15 ns (6 cycles) |
| tRP | Percharge Period | 12.5-15 ns (5-6 cycles) |
| tWR | Write Recovery Time | 15 ns (6 cycles) |
| tWTR | Write to Read | 7.5 ns (3 cycles) |

In this embodiment the said DDR2-SDRAM is emulated with MRAM with array read access of 5 ns (2 cycles) and array write access of 10 ns (4 cycles) using values for DRAM timing parameter that are less than or equal to above in Table 1.

The burst size in the DDR2-SDRAM is programmable to be 4 or 8 data units in size. In the foregoing embodiment, without loss of generality, a burst size of 4 data units is used.

FIG. 10 shows a state diagram of accessing the unit 50 when emulating a DRAM-like interface. The steps performed in causing the states of FIG. 10 are performed by the device 9, in accordance with an embodiment and method of the invention. In FIG. 10, at idle state 1000, the process goes to the ACTIVATE state 1002 where a burst read operation of the memory array is initiated. Next, at state 1004, a read command 1 is received. At state 1006, precharge is initiated followed by the idle state 1000 if this is the last precharge cycle and NOP, otherwise, if this is the last precharge cycle followed by ACTIVATE, the state transitions to the state 1002. From the state 1002, the state may go to the state 1005 where a write command is received, which is to write a burst of data. From state 1008, another write command may be received at state 1016 where the last data cycle of the previous write operation is detected. Otherwise, from the state 1008, the process may transition to the state 1012 where a burst write operation to the memory array is imitated, the last data cycle of the previous write command is encountered and no further write command is received. After the state 1012, the process may go to the state 1008 where another write command is received or it may transition to the wait state 1010. From the state 1010, where the process remains, another write command may be received where the process goes to the state 1008 or the process goes to the state 1014 where another burst read operation starts.

Burst Read (FIG. 11)

FIG. 11 shows a timing diagram of the relevant signals during an exemplary burst read operation where a burst of data with a fixed size (no. of data unit) of 4 is used and where read access from the memory array is 2 cycles long, and write access to the memory array is 4 cycles long. The ACTIVATE command initiates accessing the array to read the addressed page and loading into data latch 80. The tRCD is the page access time and in this case is 2 clock (CLK) cycle, the read or write command can be issued 2 cycles after ACTIVATE. Data is clocked out and in this example a subsequent burst read can be issued anytime after 2 cycles.

Burst Write (FIG. 12a, 12b)

FIG. 12a shows a timing diagram of the relevant signals during an exemplary burst write operation where a fix-sized burst of 4 data units is written and where read access from the memory array requires 2 cycles, and write access to the memory array requires 4 cycles and data access from the data latch 80 requires 0 cycles. The ACTIVATE command initiates accessing the array to read the addressed page and loading into data latch 80, the current mask register 66 is reset. The tRCD is the page access time and in this case is 2 cycles, the read or write command can be issued 2 cycles after ACTIVATE. The first data unit of the burst on DI 2 is received by (or clocked into) the data latch 80 after WL cycles and the corresponding bit in the current write mask register 66 is set. For DDR2 subsequent data units of the burst are clocked in data latch 80 and the corresponding bit in the current write mask register 66 is set on both rising and falling edge of clock. In this example a subsequent burst write can be issued x cycles 2 cycles.

When the last data unit of the burst is received and a new burst was not initiated, the contents of the data latch 80 is saved in write buffer 84, and the contents of the current write mask register 66 is saved in the write mask register 68. The write buffer output 46 along with the contents of the write mask register 68 is transmitted to the array 52 and a write operation of the array 52 is initiated, the write mask (or contents of the register 68) enables write of the burst thereby inhibiting writing of the rest of page in the array 52.

In accordance with an alternate method, as shown in FIG. 12b, if a new burst is not initiated and after a write recovery time tWR (typically 15 ns) a PRECHARGE (PRE) is issued the contents of the data latch 80 is saved in the write buffer 84, and the contents of the current write mask register 66 is saved in the write mask register 68. The contents of the write buffer output 46 along with the contents of the write mask register 68 is transmitted to the array 52 and writing of the array 52 is initiated, the write mask enables writing of the burst thereby inhibiting writing to the rest of the page in the array 52. The writing of the array 52 is completed prior to the ACTIVATE command as long as array write access time is less than the PRECHARGE time (tPR), which is typically 15 nano seconds (ns).

In either of the methods of FIGS. 12a and 12b, writing to the array 52 is completed before the next ACTIVATE command is received on the CNTL 8.

Burst Write Following Burst Write (FIG. 13a, 13b, 13c)

Since in this example the array write access time is 4 cycles, and in a DDR interface two data units are received in each cycle (both edges of clock), during an array burst write, 8 data units (or 2 bursts) can be received. Therefore the array write is either 1 burst (4 data units) or 2 bursts (8 data units) depending on number of bursts received or initiated. When the last data unit of the first burst is received (on DI 2) and a second burst is initiated, a wait state is entered until data for the second burst is received before initiating the array write as before. In this case, 8 data units are written to array. During array write another burst can be received this case a third burst. After the array write is complete (for first and $2^{nd}$ bursts) the third burst was received during the array write and since another burst (a forth burst) was not initiated another array write is initiated to write the third burst to the array. If another burst (the forth burst) is initiated, a wait state is entered until data for the fourth burst is received before initiating the array write as before.

In an alternate embodiment as shown in FIG. 13c, after the array write is complete (for $1^{st}$ and $2^{nd}$ bursts) the third burst is received during the array write and since another burst (a forth burst) was not initiated, a wait state is entered until another burst or a PRECHARGE after a write recovery time tWR (typically 15 ns) is detected. In this example a PRECHARGE (PRE) is issued, another array write is initiated to write the third burst to the array as before.

Burst Read Following Burst Write (FIG. 14a, 14b)

For SDRAM like interface, Data for any WRITE burst may be followed by a subsequent READ command to the same row after a tWTR (typically 7.5 ns) delay. The READ command (to the same row) can be issued a tWTR after last data unit of burst. The first data unit of READ should be available is CL delay after READ command.

FIG. 14a shows a timing diagram of the relevant signals during an example when the last data unit of the first burst is received and a second burst write is not initiate. A write operation of the array 52 is initiated as discussed before, and after a tWTR from the last data unit a burst read is issued while the array write is in progress. The write buffer output 48 is loaded into data latch 80 and the addressed data unit within the data latch 80 is selected by column decoder 63, and coupled on data out DO 4, and subsequent data are returned in subsequent cycles.

FIG. 14b shows a timing diagram of the relevant signals during an exemplary process wherein an array write is in progress and a write burst is received, and after a tWTR from the last data unit a burst read is issued. After the array write is completed another array write is initiated to write the last burst received to the array. The write buffer output 48 is loaded into data latch 80 and the addressed data unit within the data latch 80 is selected by column decoder 63, and coupled on data out DO 4, and subsequent data are returned in subsequent cycles. The read data is clocked out while the write to array is in progress, which will be completed while the read data is clocked out.

It is understood that in some embodiments, the DRAM-like interface of the embodiments and methods described and shown herein may be implemented using the device 9 of FIG. 1 or other similar systems and may comprise the system 710 of FIG. 9.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A memory device responsive to burst commands including a burst write command and a burst read command, the memory device configured to emulate a dynamic random access memory (DRAM) interface comprising:
   a memory array comprising a plurality of memory cells organized in an array of rows and columns, rows comprising of plurality of pages that stores a burst of data associated with a burst write command during burst write operations, each burst of data including sequential data units within a page and written to the memory array during a burst write operation;
   a mask register coupled to the memory array and operable to generate a write mask for the burst write operation to enable writing of data units of the burst of data in accordance with the write mask; and
   a control circuit operable to:
      initiate an array read operation after receiving an ACTIVATE command,
      initiate the burst write operation, the burst write operation being performed during multiple clock cycles,
      after receiving one or more data units of the burst of data, allow one or more subsequent burst write or read commands to begin before completion of the burst write operation in progress,
   wherein the memory device allows one or more subsequent burst write or read commands to begin before the completion of the burst write operation even while receiving data units associated with a subsequent burst write command.

2. The memory device as recited in claim 1, wherein the subsequent burst write operation is initiated after receiving a last data unit of the burst of data, if a subsequent burst of data is not arriving or if a predefined number of bursts of data has been received.

3. The memory device as recited in claim 1, further comprising:
   a data latch operable to latch a page of data in response to an array read operation and further responsive to the burst of data and coupled to the magnetic memory array, the data latch operable to output a latched data burst; and
   a write buffer operable to save the latched data burst and coupled to the memory array providing the burst of data for writing to the memory array.

4. The memory device as recited in claim 3, further comprising:
   an auxiliary write mask register including a mask bit for each data unit within the page, and responsive to the bursts of data to set the mask bits corresponding to the data burst and operable to transfer its contents to the mask register,
   wherein the control circuit is further operable to save the latched data burst and the contents of the auxiliary mask register.

5. The memory device, as recited in claim 3, wherein while a burst write operation accessing a first location within a page of data units is in progress, the memory device being operable to receive a burst read command initiating writing to a second location within the page, the memory device being operable to continue executing the burst write operation and to provide data associated with the burst read operation from the data latch.

6. The memory device as recited in claim 3, further comprising an output select coupled to the data latch and operable to generate data read from the memory array and further operable to access data saved within the data latch and to output the accessed data as the data read from the memory array in response to the burst read command.

7. The memory device, as recited in claim 1, wherein a write operation takes longer than a read operation.

8. The memory device, as recited in claim 1, wherein the memory array is made of magnetic random access memory (MRAM).

9. The memory device, as recited in claim 1, wherein the memory array is made of spin torque transfer magnetic random access memory (STTMRAM).

10. The memory device, as recited in claim 1, wherein a double data rate (DDR) scheme is employed during burst read and burst write operations.

11. The memory device, as recited in claim 1, wherein a double data rate 2 (DDR2) scheme is employed during burst read and burst write operations.

12. The memory device, as recited in claim 1, wherein a double data rate 3 (DDR3) scheme is employed during burst read and burst write operations.

13. The memory device, as recited in claim 1, wherein a low power double data rate (LPDDR) scheme is employed during burst read and burst write operations.

14. The memory device, as recited in claim 1, wherein a low power double data rate2 (LPDDR2) scheme is employed during burst read and burst write operations.

15. The memory device, as recited in claim 2, wherein during the burst write operation, the predefined number of burst of data is written to the memory array.

16. The memory device, as recited in claim 15, wherein the number of bursts of data adequately received by the memory device during the burst write operation is less than or equal to the predefined number of burst of data.

17. The memory device as recited in claim 1, wherein the control circuit is configured to initiate the burst write operation after receiving a last data unit of the burst of data being stored in the memory array, if a predefined number of bursts of data is already received, or a PRECHARGE command is issued.

18. An apparatus comprising:
digital circuitry responsive to digital information;
analog circuitry coupled to the digital circuitry and responsive to analog information;
a memory device, coupled to the digital circuitry, and having a magnetic memory unit including,
a plurality of memory cells organized in an array of rows and columns, rows comprising of plurality of pages of a burst of data associated with a burst write command during burst write operations, each burst of data including sequential data units within a page and written to the memory array during a burst write operation;
a mask register coupled to the memory array and operable to generate a write mask for the burst write operation to enable writing of data units of the burst of data in accordance with the write mask; and
a control circuit operable to:
initiate an array read operation after receiving an ACTIVATE command,
initiate the burst write operation, the burst write operation being performed during multiple clock cycles,
after receiving one or more data units of the burst of data, allow one or more subsequent burst write or read commands to begin before completion of the burst write operation in progress,
wherein the memory device allows one or more subsequent burst write or read commands to begin before the completion of the burst write operation even while receiving data units associated with a subsequent burst write command.

19. The apparatus, as recited in claim 14, further including a NOR/NAND memory coupled to the digital circuitry.

20. A memory device comprising:
a memory array operable to store bursts of data, a burst of data associated with a burst write command during burst write operations, each burst of data including sequential data units within a page and written to the memory array during a burst write operation;
a mask register coupled to the memory array, configured to receive addresses identifying a location with the memory array to which bursts of data are to be stored and operable to generate a write mask based on a received address during the burst write operation configured to store data units of a burst of data to be stored in the memory array, in accordance with the generated write mask;
a data latch coupled to the memory array to receive and send units of data from and to the memory array, the data latch operable to generate a data latch out;
an output select responsive to the data latch output;
a write buffer coupled to the data latch, responsive to the data latch output and operable to generate a write buffer output, wherein the output select is operable to selectively output the data latch output or the write buffer output as output data stored in the memory array; and
a control circuit coupled to the output select, the write buffer and the data latch, the control circuit operable to initiate a burst read or a burst write operation, wherein after receiving one or more data units of a burst of data to be stored in the memory array, the control circuit causing one or more subsequent burst write or burst read operations to begin before completion of a current burst write operation.

* * * * *